United States Patent [19]

Müller et al.

[11] 4,097,739
[45] Jun. 27, 1978

[54] BEAM DEFLECTION AND FOCUSING SYSTEM FOR A SCANNING CORPUSCULAR-BEAM MICROSCOPE

[75] Inventors: Karl-Heinz Müller; Moriz V. Rauch; Burkhard Krisch, all of Berlin, Germany; Lee H. Veneklasen, San Leandro, Calif.

[73] Assignee: Siemens Aktiengesellschaft, Berlin and Muncih, Germany

[21] Appl. No.: 719,111

[22] Filed: Aug. 31, 1976

[30] Foreign Application Priority Data

Sep. 12, 1975 Germany ............................ 2541245

[51] Int. Cl.² ............................................ H01J 37/26
[52] U.S. Cl. .................................................... 250/311
[58] Field of Search ........................ 250/396, 398, 311

[56] References Cited

U.S. PATENT DOCUMENTS

| 3,188,465 | 6/1965 | Ito et al. | 250/396 |
| 3,660,657 | 5/1972 | Brookes | 250/311 |
| 3,795,813 | 3/1974 | Kunath | 250/311 |

Primary Examiner—Bruce C. Anderson
Attorney, Agent, or Firm—Kenyon & Kenyon, Reilly, Carr & Chapin

[57] ABSTRACT

A scanning, corpuscular-beam microscope which includes a beam deflection system comprising a first stage for deflecting the beam out of the optical axis of the microscope and a second stage, disposed after the first stage along the beam path, for deflecting the beam towards the optical axis of the microscope. A first objective lens having a short focal length is disposed after the second beam deflection stage along the beam path for focusing the beam on a specimen. The improvement of the invention comprises the provision of a second objective lens having a long focal length which is disposed above the first objective lens along the beam path. The second objective lens is excited for low magnification of the specimen by the microscope and redirects the deflected beam in a direction approximately parallel to the microscope axis and focuses the beam on the specimen. The first objective lens and the second stage of the deflection system are inoperative during the redirection of the beam by the second objective lens.

3 Claims, 3 Drawing Figures

BEAM DEFLECTION AND FOCUSING SYSTEM FOR A SCANNING CORPUSCULAR-BEAM MICROSCOPE

BACKGROUND OF THE INVENTION

1. Field of the Invention

The present invention relates generally to corpuscular-beam microscopes, and in particular to an improved beam deflection and focusing system for such microscopes.

2. Description of the Prior Art

Scanning, corpuscular-beam microscopes which include a two-stage beam deflection system, the first stage of which deflects the beam out of the optical axis of the microscope and the second stage of which deflects the beam back towards the microscope axis, are known in the art. See, for example, Journal of Applied Physics, Vol. 39, pp. 5861 ff. (1968). In such microscopes, a magnetic objective lens is utilized to focus the beam of the microscope on the specimen being examined.

The disadvantage of the foregoing type of microscope is that the field of view of the microscope is limited during low-power magnification of the specimen being examined. This is due to the fact that the beam of the microscope strikes the lower deflection stage of the deflection system or the inner wall of the vacuum tube in which the beam is disposed if the beam is deflected beyond a certain lateral deflection distance.

SUMMARY OF THE INVENTION

It is therefore an object of the present invention to overcome the above-described disadvantages of heretofore known microscopes and to provide an improved beam deflection and focusing system for a scanning, corpuscular-beam microscope which permits expansion of the field of view of the microscope for low-power magnification of the specimen.

These and other objects of the invention are achieved in a scanning, corpuscular-beam microscope including a beam deflection system comprising a first stage for deflecting the beam out of the optical axis of the microscope and a second stage, disposed after the first stage along the beam path, for deflecting the beam towards the optical axis of the microscope. A first objective lens having a short focal length is disposed after the second beam deflection stage along the beam path for focusing the beam on a specimen. The improvement of the invention comprises the provision of a second objective lens having a long focal length which is disposed above the first objective lens along the beam path. The second objective lens is excited for low magnification of the specimen by the microscope and redirects the deflected beam in a direction approximately parallel to the microscope axis and focuses the beam on the specimen. The first objective lens and the second stage of the deflection system are inoperative during the redirection of the beam by the second objective lens.

In a preferred embodiment of the invention, the first objective lens is disposed in an enclosed space surrounded by a metallic housing; the second objective lens is also disposed in the enclosed space. The first and second objective lenses may comprise magnetic objective lenses.

These and other novel features of the invention will be described in greater detail in the following detailed description.

DETAILED DESCRIPTION

Figure 1:
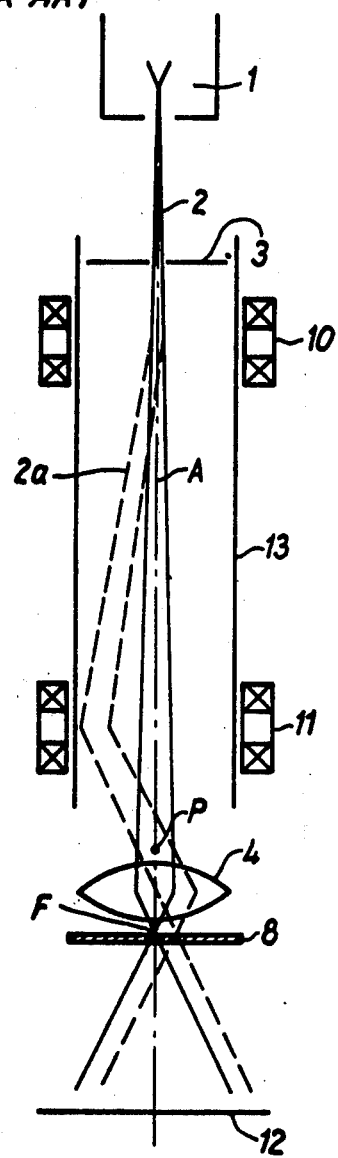
FIG. 1 is a schematic illustration of a prior art scanning, corpuscular-beam microscope including a two-stage beam deflection system.

Referring now to the drawings, and in particular to FIG. 1, there is shown a scanning, transmission-type electron microscope, illustrated in schematic form in the drawings, comprising a beam generator 1, which may comprise, for example, a field emission cathode, a radiation-aperture diaphragm 3 disposed after beam generator 1 along the beam path, and a first objective lens 4, which may comprise a magnetic objective lens, having a short focal length for focusing the electron beam on a specimen 8. Objective lens 4 must have a short focal length to produce the greatly reduced image of the beam source on specimen 8 which is required to achieve high resolution of the specimen image at high magnification powers.

The microscope also includes a beam deflection system comprising a first deflection stage 10 and a second deflection stage 11 disposed after first stage 10 along the beam path. Each of the deflection stages comprises two pairs of electro-magnetic deflection coils or, alternatively, electrostatic deflection plates, which deflect the beam in two orthogonal directions. (For the purposes of clarity, only one pair of coils has been illustrated for each deflection stage in the drawings.) Upper deflection stage 10 deflects electron beam 2 out of the microscope optical axis A and lower beam deflection stage 11 deflects the beam, after it is deflected by stage 10, back towards optical axis A, as illustrated by the dashed lines 2a in the drawings. Deflection stages 10 and 11 of the deflection system are excited so that the electron beam is pivoted or tilted about a point P disposed approximately in the focal plane of objective lens 4. The electron beam travels within an evacuated, tubular housing 13 disposed between the deflection coils of the first and second deflection stages of the deflection system. An electron detector 12 is disposed below specimen 8 in the microscope and has its output terminal coupled in the usual manner through an amplifier to the brightness control of a picture tube monitor. The deflection system is controlled synchronously with stages 10 and 11 of the beam deflection system.

The field of view of the microscope, i.e., the area of specimen 8 which can be covered by a beam raster, is determined by the permissible travel of the focus F on specimen 8. This travel is limited in microscopes of the type illustrated in FIG. 1 by the diameter of lower deflection stage 11 and the inner diameter of tubular housing 13 since, as can be seen in FIG. 1, electron beam 2a strikes these components of the microscope at the height of deflection stage 11. The possible travel of the focus F can theoretically be increased by increasing the diameter of the deflection stage 11 or by moving this deflection stage closer to objective lens 4. Both such possibilities, however, are limited in effect by the dimensions of the objective lens. The limitation of the field of view in the microscope generally becomes noticeable at low magnification powers of, for example, 1,000.

Figure 2:
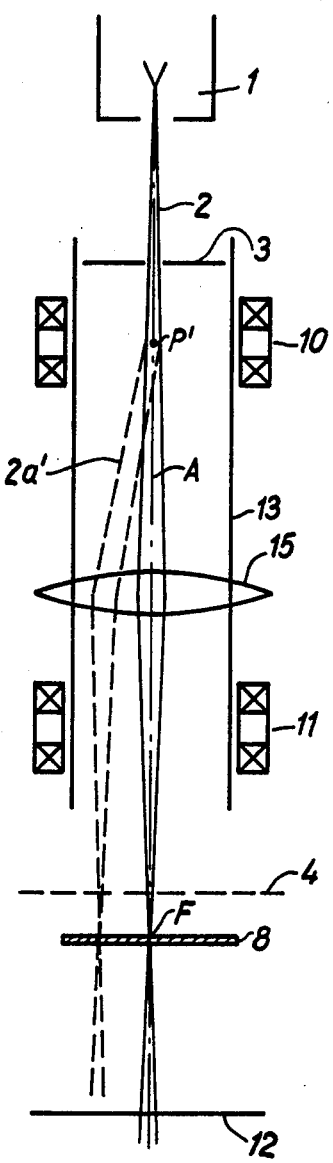
FIG. 2 is a schematic illustration of an improved beam deflection and focusing system for a scanning, corpuscular-beam microscope constructed according to the present invention.

An improved beam deflection and focusing system for a scanning electron microscope is illustrated in FIG. 2 which permits the travel of the focus F to be increased on specimen 8 while, at the same time, retaining the dimensions of objective lens 4. Thus, in the arrangement according to the invention, a second objective lens 15 is provided in addition to first objective lens 4 (the latter of which is illustrated schematically in FIG. 2 by the dashed lines). The second objective lens may comprise, for example, a magnetic objective lens, and has a focal length which is substantially longer than that of first objective lens 4. At low magnification powers, only second objective lens 15 is excited and this excitation is carried out so that the lens focuses either beam 2 or beam 2a' on specimen 8. The first deflection stage 10 is used to deflect the electron beam at low magnification powers. However, second deflection stage 11 and objective lens 4 are both rendered inoperative during examination of a specimen at low magnification powers. As shown in FIG. 2, deflection stage 10 deflects the electron beam of the microscope through a distance which is chosen so that the beam is tilted by stage 10 about a point P' which lies approximately in the focal plane of second objective lens 15. Thus, the deflected beam 2a' travels in a direction which is approximately parallel to the optical axis of the microscope below objective lens 15.

The invention permits the area of specimen 8 which can be travelled by the raster to be substantially increased compared to microscopes of the type illustrated in FIG. 1, and the field of view of the microscope to be enlarged, since an optical reduction of the deflection effected by objective lens 14 is eliminated. The fact that the image of the electron beam source at focus F is larger in the arrangement illustrated in FIG. 2 than in prior art microscopes of the type illustrated in FIG. 1 has no detrimental effect since high image resolution is not required at low magnification powers.

Figure 3:
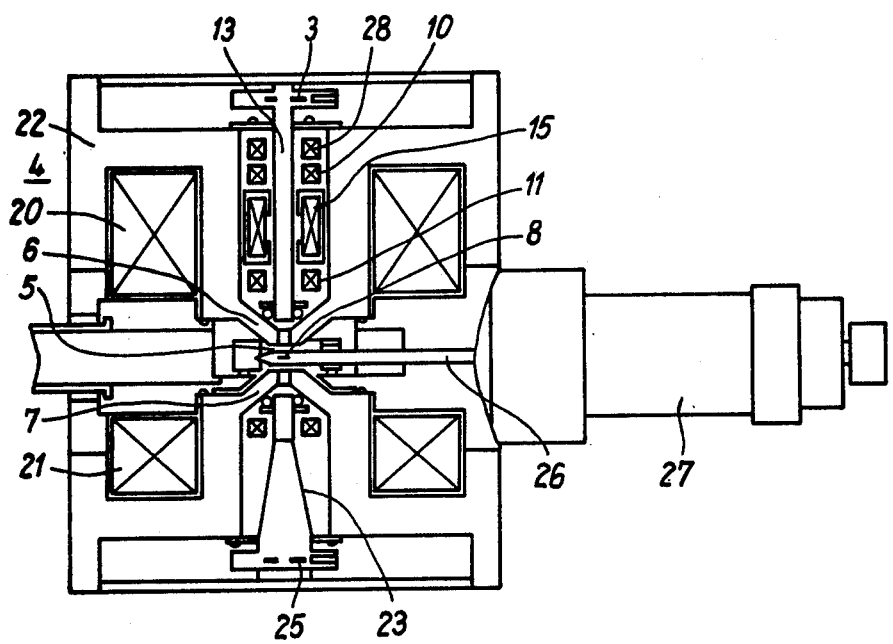
FIG. 3 is a plan view of a scanning, corpuscular-beam microscope constructed according to the present invention.

As illustrated in FIG. 3, first objective lens 4 may comprise a pair of windings 20 and 21 which are surrounded by a metallic housing, specifically an iron jacket 22. The magnetic field which exists between pole pieces 6 and 7 functions as the magnetic objective lens. The electron beam of the microscope travels within a pair of evacuated tubular housings 13 and 23 in which a radiation-aperture diaphragm 3 and a detector aperture 25 are disposed. The microscope also includes a stigmator identified in the drawings by the reference numeral 28. The specimen examined in the microscope is supported by a rod-shaped specimen holder 26 which can be inserted into objective lens gap 5 from the side of the microscope through a housing lock 27. The specimen holder is movable with respect to the electron beam of the microscope by means of control elements (not shown in the drawings). Stages 10 and 11 of the beam deflection system and second objective lens 15 are disposed within a central space surrounded by iron jacket 22 above pole piece 6.

Second objective lens 15 can be utilized to produce diffraction images within the microscope. If it is used to do so, the lens is adjusted, with objective lens 4 inoperative, so that the electron beam is directed as a parallel beam of rays onto specimen 8. The second objective lens can also be utilized to examine objects, in particular, magnetic objects, in the magnetic field-free space of the microscope.

It should be noted that although the invention has been described with reference to an electron microscope, it can also be utilized in scanning surface electron microscopes in which, for example, secondary or backscattered electrons generate the microscope image. The invention can also be advantageously utilized in scanning ion microscopes.

In the foregoing, the invention has been described with reference to specific exemplary embodiments thereof. It will, however, be evident that various changes and modifications may be made thereunto without departing from the broader spirit and scope of the invention as set forth in the appended claims. The specification and drawings are, accordingly, to be regarded in an illustrative rather than in a restrictive sense.

What is claimed is:

1. In a scanning, corpuscular-beam microscope including a beam deflection system comprising a first stage for deflecting the beam out of the optical axis of the microscope and a second stage, disposed after the first stage along the beam path, for deflecting the beam towards the optical axis of the microscope, and a first objective lens having a short focal length, disposed after the second beam deflection stage along the beam path, for focusing the beam on a specimen, the improvement comprising, a second objective lens having a long focal length and disposed above said first objective lens along the beam path, said second objective lens being excited for low magnification of the specimen by the microscope and redirecting said deflected beam in a direction approximately parallel to said microscope axis and focusing said beam on said specimen, said first objective lens and said second stage of said deflection system being inoperative during said redirection of said beam by said second objective lens.

2. The microscope recited in claim 1, wherein said first objective lens is disposed in an enclosed space surrounded by a metallic housing, said second objective lens also being disposed in said enclosed space of said housing.

3. The microscope recited in claim 2, wherein said first and second objective lenses comprise magnetic objective lenses.

* * * * *